United States Patent
Mu et al.

(10) Patent No.: US 7,742,340 B2
(45) Date of Patent: Jun. 22, 2010

(54) READ REFERENCE TECHNIQUE WITH CURRENT DEGRADATION PROTECTION

(75) Inventors: Fuchen Mu, Austin, TX (US); Marco A. Cabassi, Austin, TX (US); Ronald J. Syzdek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 200 days.

(21) Appl. No.: 12/048,683

(22) Filed: Mar. 14, 2008

(65) Prior Publication Data

US 2009/0231925 A1 Sep. 17, 2009

(51) Int. Cl.
*G11C 16/06* (2006.01)
(52) U.S. Cl. .............. 365/185.2; 365/185.21; 365/189.04
(58) Field of Classification Search .......... 365/185.2, 365/185.21, 185.22, 185.23, 189.04
See application file for complete search history.

(56) References Cited

U.S. PATENT DOCUMENTS

| | | | | |
|---|---|---|---|---|
| 5,491,662 | A * | 2/1996 | Pezzini | 365/189.03 |
| 6,097,632 | A * | 8/2000 | Roohparvar | 365/185.19 |
| 6,198,657 | B1 | 3/2001 | Uekubo et al. | |
| 6,396,741 | B1 | 5/2002 | Bloom et al. | |
| 6,754,125 | B2 | 6/2004 | Fournel et al. | |
| 6,813,189 | B2 * | 11/2004 | Kurihara | 365/185.2 |
| 6,928,000 | B2 * | 8/2005 | Homma et al. | 365/185.2 |
| 7,180,782 | B2 | 2/2007 | Yu et al. | |

OTHER PUBLICATIONS

International Search Report for corresponding PCT Application No. PCT/US2009/031945 mailed Apr. 20, 2009.

* cited by examiner

*Primary Examiner*—Pho M. Luu

(57) ABSTRACT

A set of reference cells is used for sensing the data values stored at bit cells of a memory device. In response to an event, the reference cell providing the highest output of the set is selected as the reference cell to be used for subsequent memory access operations. The remaining reference cells are disabled so that they can recover back to or near their original non-degraded states. At each successive event, the set of reference cells can be reassessed to identify the reference cell that provides the highest output at that time and the memory device can be reconfigured to utilize the reference cell so identified. By utilizing the reference cell having the highest output to provide the read reference and disabling the remaining reference cells, the likelihood of the read reference falling below a minimum threshold can be reduced.

20 Claims, 3 Drawing Sheets

READ REFERENCE TECHNIQUE WITH CURRENT DEGRADATION PROTECTION

FIELD OF THE DISCLOSURE

The present disclosure relates generally to memory devices and more particularly to non-volatile memory devices utilizing reference cells.

BACKGROUND

Non-volatile memory (NVM) devices typically are composed of an array of bit cells, with each bit cell storing a corresponding bit of data. Each bit cell generally is configured as one or more transistors capable of storing charge, and thereby affecting the relationship between the control electrode voltage and the drain current of the transistor. The transistor is "erased" to one state (e.g., a logic "1") by clearing the charge and the transistor is "programmed" to another state (e.g., a logic "0") by storing charge at the transistor. Thus, the bit value "stored" by the transistor can be sensed by comparing a reference (either a current or a voltage) with the drain current of the transistor in response to the application of a read voltage to the control electrode of the transistor, whereby the "stored" value is determined to be one state (e.g., a logic "1" or an "erased" state) if the drain current is greater than the read reference and determined to be another state (e.g., a logic "0" or a "programmed" state) if the drain current is less than the read reference.

Conventional NVM architectures make use of a reference cell to generate the read reference, whereby the reference cell is similar in structure as the bit cells used to store data so as to closely mimic the characteristics of the bit cells being sensed. However, the reference current output by a reference cell typically decreases during operation. Under certain conditions, this degradation of the read reference output by the reference cell can result erroneous read and write operations. Implementations having memories in continuous or near-continuous operation are particularly susceptible to the degradation of the reference cell. Accordingly, an improved technique for implementing a reference cell for sensing bit cells of a memory device would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

As discussed above, a reference cell typically degrades such that its output current decreases during continuous operation. Given a sufficient operational duration, this degradation can cause the output current of the reference cell to fall below a minimum threshold and thereby cause errors during memory access operations. The inventors have discovered that reference cells also typically recover or ("relax") once they are disabled or otherwise not powered at an operational voltage such that the potential output current of a degraded reference cell increases over time back to or near the original output current before degradation occurred. The inventors also have discovered that the rate of degradation of a reference cell when enabled and the corresponding rate of relaxation when then disabled often are substantially proportional and often can be substantially equal for a given ambient temperature. Accordingly, in at least one embodiment, a set of reference cells is used for sensing the data values stored at bit cells of a non-volatile memory (NVM) device. In response to an event, the reference cell providing the highest output (current, or alternately voltage) of the set is selected as the reference cell to be used for subsequent memory access operations. The remaining reference cells of the set of reference cells are disabled so that they can recover back to or near their original non-degraded states. At each successive event, the set of reference cells can be reassessed to identify the reference cell that provides the highest output current of the set at that time and the NVM device can be reconfigured to utilize the reference cell so identified. By utilizing the reference cell having the highest output current (or, alternately, voltage) to provide the read reference and disabling the remaining reference cells so that one or more of them can recover, the likelihood of the read reference falling below a minimum threshold is reduced or eliminated, thereby reducing the possibility of errors during memory access operations to the bit cells.

For ease of discussion, the techniques of the present disclosure are described in an example context whereby the sense reference comprises a reference current and the sense reference can be selected as the output current of one of two reference cells. However, the techniques of the present disclosure can be utilized in a reference voltage context or in an implementation with more than two selectable reference cells without departing from the scope of the present disclosure.

Figure 1:
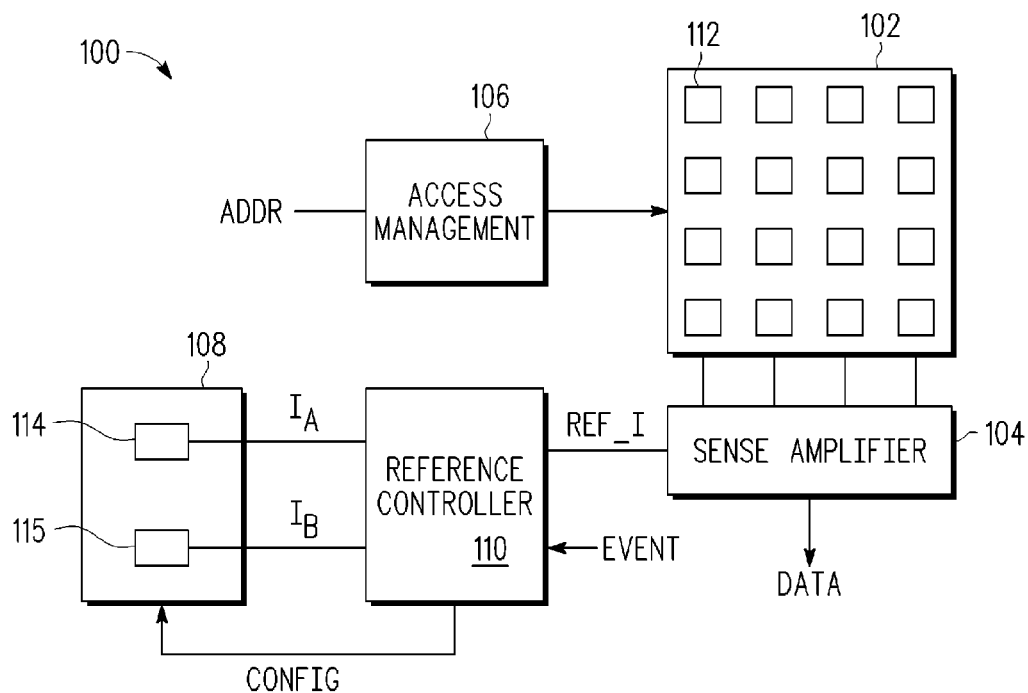
FIG. 1 is a block diagram illustrating a non-volatile memory (NVM) device utilizing interchangeable reference cells in accordance with at least one embodiment of the present disclosure.

FIG. 1 illustrates a non-volatile memory (NVM) device 100 in accordance with at least one embodiment of the present disclosure. The NVM device 100 can be implemented as one or more separate integrated circuits (ICs), such as in an application specific integrated circuit (ASIC), or other stand-alone memory device. Alternately, the NVM device 100 can be implemented in another device, such as, for example, a microprocessor or microcontroller implemented as a system-on-a-chip (SOC).

In the depicted example, the NVM device 100 includes a NVM array 102, a sense amplifier 104, an access management module 106, a reference cell array 108, and a reference controller 110. The reference controller 110 and the access management module 106 can be configured as, for example, state machines or other hardware-based components (e.g., digital logic components). The NVM array 102 includes a bit cell matrix comprising a plurality of bit cells 112 of the NVM array 102. The NVM array 102 can include any of a variety of non-volatile memory cell architectures, such as, for example, thin-film storage (TFS) architectures, high K dielectric or nanocrystal architectures, nitride-based architectures, resistive memory architectures, magnetic random access memory (MRAM) architectures, and the like. For ease of illustration, the NVM array 102 is depicted as a 4×4 bit cell array, but in implementation the NVM array 102 typically includes a substantially greater number of bit cells.

The NVM array 102 is configured to access a memory location of the NVM array 102 based on a supplied address (signal ADDR). In at least one embodiment, each memory location includes a data field to store a data value comprised of a plurality of bit values. The sense amplifier 104 is configured to sense the bit values stored in the set of bit cells at the accessed memory location based on a supplied reference current REF_I and provide the sensed bit values at the memory location as a data value DATA[n−1:0]. During an access to a particular memory location, a voltage is applied to the control electrode of each of the plurality of bit cells of the memory location the sense amplifier 104 compares the resulting drain currents of the corresponding bit cells with the reference current REF_I. In the event that the drain current of a bit cell is greater than the reference current REF_I, output of the sense amplifier 104 for the corresponding bit of DATA[n−1:0] is asserted as, for example, a logic "1" so as to indicate the sensing of a logic "1" stored at the corresponding bit cell. Conversely, in the event that the drain current of the bit cell is not greater than the reference current REF_I the output of the sense amplifier 104 for the corresponding bit is asserted as, for example, a logic "0" so as to indicate the sensing of a logic "0" stored at the corresponding bit cell. Thus, the sensed value for each of the bits of the DATA[0:n−1] value is based on the relationship between the drain current of the corresponding bit cell and the reference current REF_I.

The reference cell array 108 includes a plurality of reference cells (e.g., reference cells 114 and 115), each capable of providing an output current (e.g., $I_A$ and $I_B$) that can be selected for use as the reference current REF_I when sensing bit cells of the NVM array 102. Although FIG. 1 illustrates a reference cell array 108 having two reference cells, more than two reference cells can be utilized. Further, the reference cell array 108 can implement different sets of selectable reference cells for different sectors or other subdivisions of the NVM array 102. In at least one embodiment, the reference cells 114 and 115 of the reference cell array 108 and the bit cells 112 of the NVM array 102 have the same cell configuration so as to permit the reference cells 114 and 115 to mimic the characteristics of the bit cells 112.

The reference controller 110 includes an input to receive an event indicator in response to the occurrence of a predetermined event, such as a power-on event, a reset event, a lapsed time or number of cycles, execution of a particular instruction by an associated processor, occurrence of a particular interrupt at an associated processor, an access to a particular memory address of the NVM device, and the like. In response to an assertion of the event indicator indicating an occurrence of a predetermined event, the reference controller 110 initiates a configuration mode by asserting the signal CONFIG. During the configuration mode, the reference controller 110 determines which reference cell generates the highest output current for the set of reference cells. The reference controller 110 keeps the identified reference cell enabled and disables the remaining reference cells so as to facilitate recovery of the remaining reference cells. For a memory access operation to the NVM array 102, the reference controller 110 provides the output current of the enabled reference cell of the set as the reference current REF_I to the sense amplifier 104 for sensing data stored at bit cells of the NVM array 102.

Figure 2:
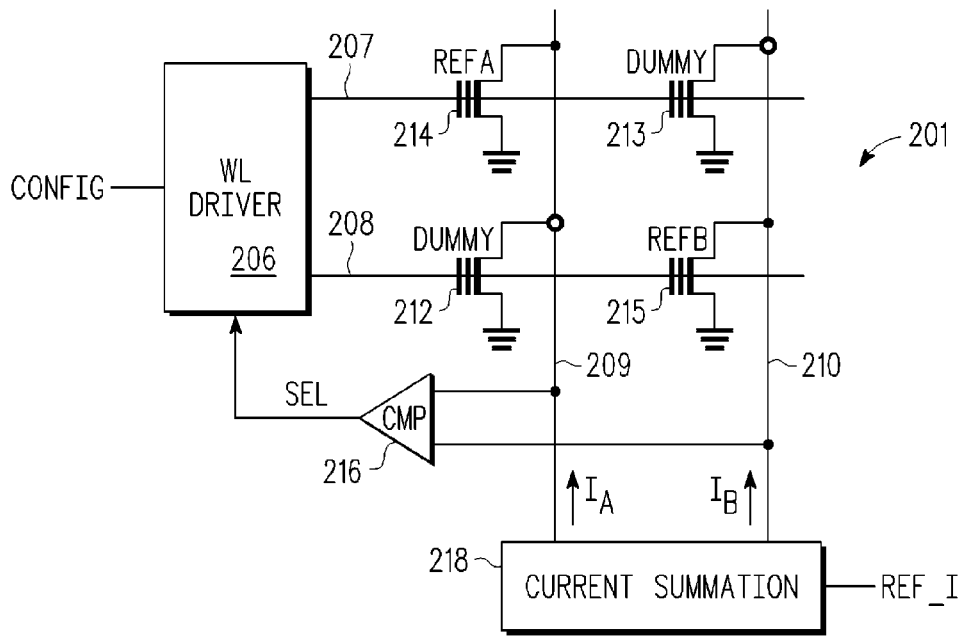
FIG. 2 is a circuit diagram illustrating an implementation of a reference cell array and a reference controller of the NVM device of FIG. 1 in accordance with at least one embodiment of the present disclosure.

FIG. 2 illustrates an implementation of the reference cell array 108 and the reference controller 110 of FIG. 1 in accordance with at least one embodiment of the present disclosure. In the depicted example, the reference cell array 108 includes a set configuration 201 configured to provide two or more currents (currents $I_A$ and $I_B$ in FIG. 2), one of which is selected as the reference current REF_I for use in sensing bit cells of the NVM array 102 (FIG. 1).

In the depicted example, the set configuration 201 includes a word line driver 206, a word line 207 and a word line 208, a bit line 209 and a bit line 210, a set of four reference cells 212, 213, 214, and 215, a comparator 216, and a current summation module 218. The reference cells 214 and 215 (REFA and REFB, respectively) are operational reference cells and the reference cells 212 and 213 are non-operational cells (i.e., "dummy cells") that are implemented so that the reference cell array 108 can have the same array architecture as the NVM array 102 (FIG. 1). The reference cell 214 includes a floating gate transistor comprising a first current electrode connected to the bit line 209, a second current electrode connected to a voltage reference (e.g., ground), and a control electrode connected to the word line 207. The reference cell 215 includes a first current electrode connected to the bit line 210, a second current electrode connected to the voltage reference, and a control electrode connected to the word line 208. The reference cells 212 and 213 are not connected to the bit lines 209 and 210. Although a particular single floating-gate implementation is illustrated for the reference cells 212-215, other reference cell architectures can be implemented without departing from the scope of the present disclosure. To illustrate, each reference cell could include two or more floating gate transistors in parallel.

The current summation module 218 is coupled to the bit line 209 and the bit line 210 and is configured to generate the reference current REF_I that is the sum of the current $I_A$ on the bit line 209 and the current $I_B$ on the bit line 210 (although one or both of currents $I_A$ and $I_B$ may be substantially zero in certain situations as described below). The current comparator 216 includes an input coupled to the bit line 209, an input coupled to the bit line 210, and an output to provide a signal SEL. The current comparator 216 is configured to assert or unassert/deassert the signal SEL based on a comparison of the current $I_A$ and the current $I_B$, thereby indicating which of bit lines 209 and 210 has the highest current of the two bit lines. The word line driver 206 includes inputs to receive the configuration signal CONFIG, an input to receive the signal SEL, and outputs to selectively drive the word lines 207 and 208 so as to separately enable or disable the reference cells 214 and 215.

In response to a predetermined event such as a reset event, the reference controller 110 temporarily asserts the CONFIG signal. In response to the assertion of the CONFIG signal, the word line driver 206 asserts both the word line 207 and the word line 208, thereby causing the floating gate transistor of the reference cell 214 to drive the current $I_A$ on the bit line 209 and causing the floating gate transistor of the reference cell 215 to drive the current $I_B$ on the bit line 210. The current comparator 216 compares the resulting currents $I_A$ and $I_B$ and configures its output so that the signal SEL reflects the relationship between the currents. For example, the current comparator 216 could assert the signal SEL when the current $I_A$ is higher than the current $I_B$, and deassert/unassert the signal SEL when the current $I_A$ is lower than the current $I_B$.

The word line driver 206 latches the state of the signal SEL and, based on the state of the signal SEL, identifies the reference cell that is providing the greater current of the two. The word line driver 206 then deasserts the word line associated with the other reference cell while continuing to assert the word line associated with the identified reference cell. To illustrate, assuming that the reference cell 214 has the greater output current of the two reference cells 214 and 215, the word line driver 206 deasserts the word line 208 so as to disable the reference cell 215 and continues to assert the word line 207 so as to keep the reference cell 214 in an enabled state so as to continue driving the current $I_A$. Conversely, in the event that the reference cell 215 has the greater output current of the two reference cells 214 and 215, the word line driver 206 would deassert the word line 207 so as to disable the reference cell 214 and continue to assert the word line 208 so as to maintain the reference cell 215 in an enabled state.

As described above, the current summation module 218 sums the current $I_A$ and $I_B$ and provides the resulting current as the reference current REF_I to the sense amplifier 104 (FIG. 1). However, as only one of the current $I_A$ and the current $I_B$ is substantially non-zero after the initial configuration mode, the reference current REF_I is equal to the output current of the one of the reference cells 214 and 215 which outputs the greater current of the two reference cells. In an alternate embodiment, the current summation module 218 can be implemented as a switch matrix controlled by the signal SEL so as to selectively connect either the bit line 209 or the bit line 210 to the corresponding input of the sense amplifier 104.

Although FIG. 2 illustrates a particular embodiment implementing two reference cells from which the reference current can be selected, more than two reference cells can be used without departing from the scope of the present disclosure. To illustrate, four reference cells could be used and the comparator 216 could determine which of the four reference cells is driving the highest output current when the configuration signal CONFIG is asserted in response to an event. The word line driver 206 then could disable the remaining three reference cells so that the reference current REF_I output by the current summation module 218 is the highest output current of the four reference cells.

Figure 3:
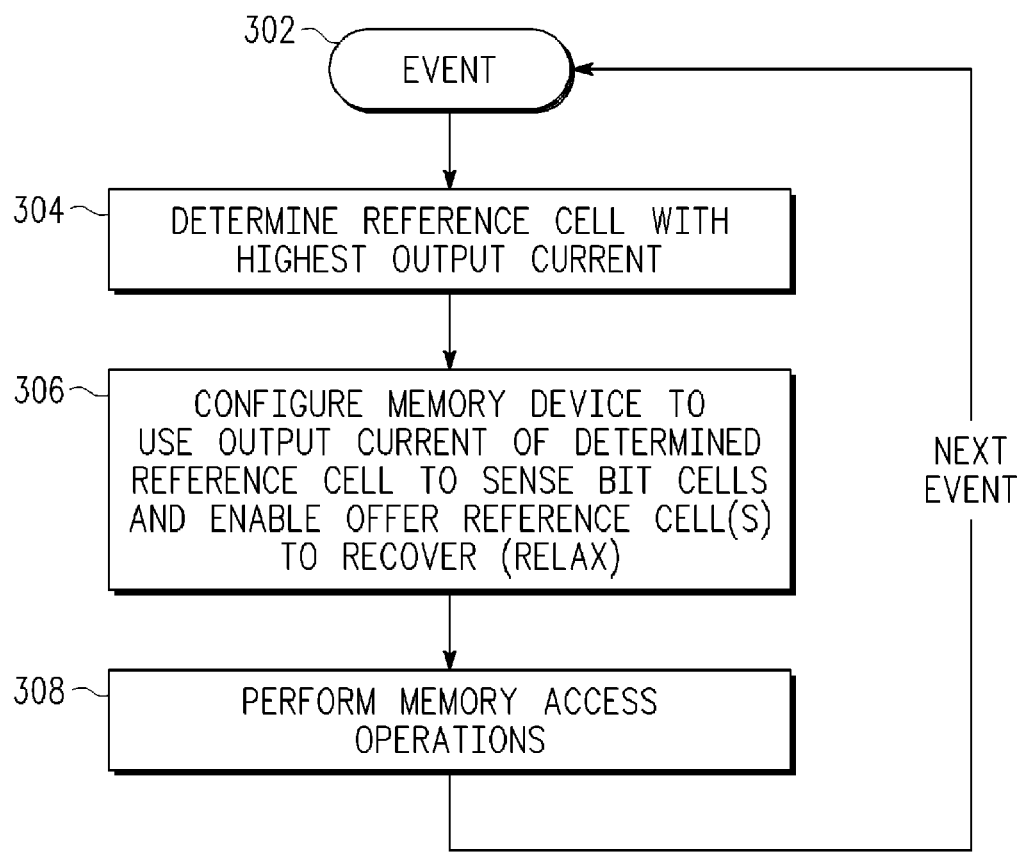
FIG. 3 is a flow diagram illustrating a method for selecting one of a plurality of reference cells for sensing bit cells in a NVM device in accordance with at least one embodiment of the present disclosure.

FIG. 3 illustrates a method 300 of operation of the NVM device 100 in accordance with at least one embodiment of the present disclosure. At block 302, a predetermined event is detected at the NVM device 100. The predetermined event can include, for example, a reset event (such as power-on event or a soft reset event), the generation of a particular interrupt (e.g., an interrupt generated by a timer), execution of a particular instruction, and the like.

In response to detecting the event, at block 304 the reference controller 110 of the NVM device 100 determines which reference cell of the reference cell array 108 provides the highest output current. As described with reference to FIG. 2, the reference cell with the highest output current can be determined by enabling all reference cells and then using a current comparator to identify the highest output current.

At block 306, the reference controller 110 configures the NVM device 100 to use the output current of the reference cell identified at block 304 for sensing bit cells of the NVM array 102. As illustrated by FIG. 2, this configuration can include configuring the word line driver 206 of the set configuration 201 so as to enable the reference cell having the highest output current and disabling all remaining reference cells such that the output current of the set configuration 201 is substantially equal to the output current of the reference cell identified at block 304.

At block 308, memory access operations can be performed with the NVM device 100 so configured at block 306. The configuration performed at block 306 can be continued for memory access operations at block 308 until another predetermined event occurs at a next iteration of block 302, at which point the reference cells can be reassessed again at block 304 and the NVM device 100 reconfigured at block 306 as appropriate. The predetermined event that for the next iteration of the method 300 can include the same event or a different event as that in the previous iteration of the method 300.

Figure 4:
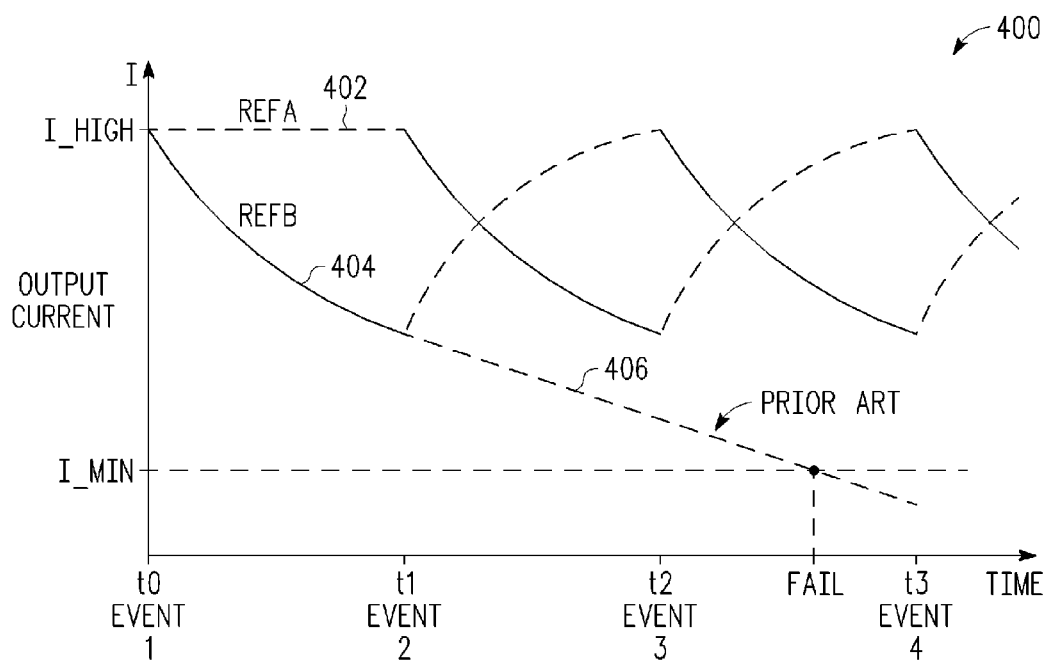
FIG. 4 is a chart diagram illustrating an event-based selection of reference cells from a plurality of reference cells for sensing bit cells in a NVM device in accordance with at least one embodiment of the present disclosure.
Figure 5:
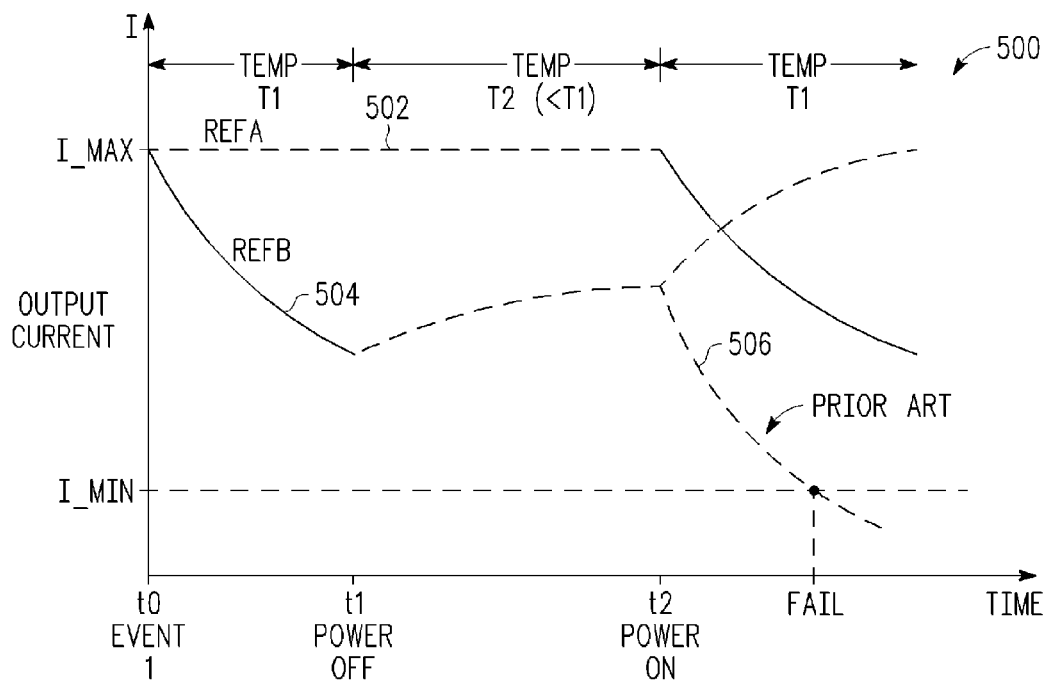
FIG. 5 is a chart diagram illustrating another event-based selection of reference cells from a plurality of reference cells for sensing bit cells in a NVM device in accordance with at least one embodiment of the present disclosure.

FIGS. 4 and 5 are charts illustrating various operating examples of the NVM device 100 of FIGS. 1 and 2 in accordance with at least one embodiment of the present disclosure. For both charts, two reference cells, REFA and REFB (e.g., reference cells 214 and 215, FIG. 2), are available to provide a reference current for sensing data values at bit cells of the NVM array 102.

In FIG. 4, a chart 400 depicts the output currents (or potential output currents) of the two reference cells REFA and REFB over time, with line 402 representing the output current of the reference cell REFA and line 404 representing the output current of the reference cell REFB. For lines 402 and 404, a solid line represents the actual output current of the corresponding reference cell at the corresponding time, and a dashed line represents the output current that the corresponding reference cell would be able to generate at the corresponding time should the reference cell be enabled at that point in time.

At time $t_0$ the NVM device 100 is powered on (event 1). In response, the reference controller 110 determine which reference cell has the highest output current. For this example, assume that it is the reference cell REFB that has the highest output current. Accordingly, the reference controller 110 disables the reference cell REFA and utilizes the output current of the reference cell REFB as the reference current for sensing bit cells. As illustrated by line 404, the output current of the reference cell REFB degrades during operation from a maximum output current I_High toward the minimum reference current I_Min before sensing errors occur. Prior to degrading to the minimum reference current I_Min, another event (e.g., a soft reset or timer lapse) occurs at time $t_1$. In response, the reference controller 110 enables both reference cells REFA and REFB and determines which one provides the higher output current. In the example of FIG. 4, the reference cell REFA provides the highest output current at time $t_1$ due to the degradation of the reference cell REFB due to its operation up to time $t_1$. Accordingly, the reference controller 110 disables the reference cell REFB and utilizes the output current of the reference cell REFA as the reference current REF_I for sensing bit cells of the NVM array 102 following time $t_1$.

As illustrated by line 402, the output current of the reference cell REFA degrades during its operation following time $t_1$. Conversely, as illustrated by line 404, the disabled reference cell REFB is able to recover or "relax" following time $t_1$. Accordingly, at or prior to time $t_2$ the output current of the reference cell REFA becomes less than the potential output current of the reference cell REFB. Thus, when another event occurs at time $t_2$, the reference cell REFB provides the greater output current of the two references when both are reassessed in response to the event. The reference controller 110 therefore disables the reference cell REFA and utilizes the output current of the enabled reference cell REFB as the reference current for sensing bit cells of the NVM array 102 following time $t_2$. Meanwhile, the disabled reference cell REFA is able to recover while the reference cell REFB is in use. At time $t_3$, another event occurs and the reassessment of the output currents of the reference cells REFA and REFB for selection can occur again.

As illustrated by chart 400, by selecting and utilizing the reference cell having the highest output current as the reference cell for sensing purposes while disabling the other reference cells of the set, the reference cells of the set can be rotated in and out of use, thereby allowing the reference cell in use during one duration to recover back to its original output current during the next duration. As a result, the reference current can be maintained at a level higher than the minimum reference current I_Min. In contrast, as illustrated by line 406, the conventional use of a single reference cell ultimately can cause the single reference cell to degrade to a point that its output current, and thus the reference current used to sense bit cells, is below the minimum reference current I_Min, which typically leads to sensing errors.

FIG. 5 similarly illustrates a chart 500 that the output currents (or potential output currents) of the two reference cells REFA and REFB over time, with line 502 representing the output current of the reference cell REFA and line 504 representing the output current of the reference cell REFB. For lines 502 and 504, a solid line represents the actual output current of the corresponding reference cell at the corresponding time, and a dashed line represents the output current that the corresponding reference cell would be able to generate at the corresponding time should the reference cell be enabled at that point in time.

At time $t_0$ the NVM device 100 is powered on. In response, the reference controller 110 determines which reference cell has the highest output current. For this example, assume that it is the reference cell REFB that has the highest output current. Accordingly, the reference controller 110 disables the reference cell REFA and utilizes the output current of the reference cell REFB as the reference current for sensing bit cells. As illustrated by line 504, the output current of the reference cell REFB degrades during operation from a maximum output current I_High toward the minimum reference current I_Min. Assume for this example that the NVM device 100 is operating at a temperature T1 (e.g., 85 C).

The NVM device 100 then is powered off between times $t_1$ and $t_2$, which disables both reference cells REFA and REFB. As a result, the reference cell REFB is able to begin recovering. However, for the duration between time $t_1$ and $t_2$, the NVM device 100 is at a lower ambient temperature of T2 (e.g., 25 C). Thus, because the rate of recovery of a reference cell is in some degree proportional to its temperature, the reference cell REFB has not fully recovered by the time the NVM device 100 is powered on again (time t2). As such, the reference cell REFA has a higher output current at time $t_2$ and the reference controller 110 therefore selects the reference cell REFA for provision of the reference current for sensing bit cells following time $t_2$. However, because the temperature of the NVM device 100 increases back to temperature T1 during operation following time $t_2$, the reference cell REFB is able to recover at a faster rate and therefore likely will be selected in response to the next event to occur due to the degradation of the reference cell REFA in operation following time $t_2$.

As illustrated by chart 500, a reference current higher than the minimum current I_Min can be maintained by allowing the reference cell having the lower output current to more fully recover, even in the event of a decreased rate of recovery due to lower temperatures. In contrast, as illustrated by line 506, the conventional use of a single reference cell ultimately can cause the single reference cell to degrade to a point that its output current, and thus the reference current used to sense bit cells, is below the minimum reference current I_Min.

In accordance with one aspect of the present disclosure, a select reference cell of a plurality of reference cells associated with a plurality of bit cells of a bit cell array of a memory device as having the highest output current of the plurality of reference cells is determined at a first time. A data value stored at a bit cell of the plurality of bit cells is sensed using an output current of the select reference cell.

In accordance with another aspect of the present disclosure, a memory comprising a bit cell array, a plurality of reference cells associated with a plurality of bit cells of the bit cell array, and a sense amplifier is provided. At a first event, the sense amplifier is configured to utilize an output current of a first reference cell of the plurality of reference cells in response to determining the output current of the first reference cell is the highest output current of the first plurality of reference cells at the first event. At a second event subsequent to the first event, the sense amplifier is configured to utilize an output current of a second reference cell of the plurality of reference cells in response to determining the output current of the second reference cell is the highest output current of the plurality of reference cells at the second event.

In accordance with yet another aspect of the present disclosure, a memory device is provided. The memory device includes a bit cell array comprising a plurality of bit cells and a plurality of reference cells associated with the plurality of bit cells. The memory device further includes a sense amplifier comprising an input to receive a reference current, the sense amplifier configured to sense data values stored at bit cells of the bit cell array based on the reference current. The memory device also comprises a reference controller configured to provide an output current of a select reference cell of the plurality of reference cells to the sense amplifier as the reference current for sensing a bit cell of the plurality of bit cells in response to determining the select reference cell as having the highest output current of the plurality of reference cells.

The preceding description is intended to convey a thorough understanding of the present disclosure by providing a number of specific embodiments and details involving adjusting the read reference for a non-volatile memory. It is understood, however, that the present disclosure is not limited to these specific embodiments and details, which are exemplary only, and the scope of the disclosure is accordingly intended to be limited only by the following claims and equivalents thereof. It is further understood that one possessing ordinary skill in the art, in light of known systems and methods, would appreciate the use of the present disclosure for its intended purposes and benefits in any number of alternative embodiments, depending upon specific design and other needs.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

What is claimed is:

1. A method comprising:
   determining, at a first time, a first reference cell of a plurality of reference cells associated with a plurality of bit cells of a bit cell array of a memory device as having the highest output current of the plurality of reference cells at the first time; and
   sensing a data value stored at a first bit cell of the plurality of bit cells using a first output current of the first reference cell.

2. The method of claim 1, further comprising:
   determining, at a second time subsequent to the first time, a second reference cell of the plurality of reference cells as having the highest output current of the plurality of reference cells at the second time; and
   sensing a data value stored at a second bit cell of the plurality of bit cells using a second output current of the second reference cell.

3. The method of claim 1, further comprising:
   disabling each reference cell of the plurality of reference cells except the first reference cell for a first duration between the first time and the second time; and
   disabling each reference cell of the plurality of reference cells except the second reference cell for a second duration following the second time.

4. The method of claim 3, wherein:
   determining the first reference cell as having the highest output current of the plurality of reference cells at the first time comprises determining the first reference cell as having the highest output current of the plurality of reference cells in response to a first event; and
   determining the second reference cell as having the highest output current of the plurality of reference cells at the second time comprises determining the second reference cell as having the highest output current of the plurality of reference cells in response to a second event subsequent to the first event.

5. The method of claim 4, wherein the first event and the second event each respectively comprises one selected from a group consisting of: a power-on event; a reset event; an interrupt event; and a lapse of a predetermined duration.

6. The method of claim 3, further comprising:
   determining, at a third time subsequent to the second time, the first reference cell of the plurality of reference cells as having the highest output current of the plurality of reference cells at the third time; and
   sensing a data value stored at a third bit cell of the plurality of bit cells using a third output current of the first reference cell.

7. The method of claim 6, further comprising:
   disabling each reference cell of the plurality of reference cells except the first reference cell for a first duration between the first time and the second time; and
   disabling each reference cell of the plurality of reference cells except the second reference cell for a second duration between the second time and the third time; and
   disabling each reference cell of the plurality of reference cells except the first reference cell for a third duration following the third time.

8. The method of claim 1, further comprising:
   disabling each reference cell of the plurality of reference cells except the first reference cell for a duration following the first time.

9. A method comprising:
   providing a memory comprising a bit cell array, a plurality of reference cells associated with a plurality of bit cells of the bit cell array, and a sense amplifier;
   at a first event, configuring the sense amplifier to utilize an output current of a first reference cell of the plurality of reference cells in response to determining the output current of the first reference cell is the highest output current of the plurality of reference cells at the first event;
   at a second event subsequent to the first event, configuring the sense amplifier to utilize an output current of a second reference cell of the plurality of reference cells in response to determining the output current of the second reference cell is the highest output current of the plurality of reference cells at the second event.

10. The method of 9, further comprising:
    at a third event, configuring the sense amplifier to utilize the output current of the first reference cell in response to determining the output current of the first reference cell is the highest output current of the plurality of reference cells at the third event.

11. The method of claim 10, wherein the third event is subsequent to the second event.

12. The method of claim 10, wherein the third event is subsequent to the first event and prior to the second event.

13. The method of claim 9, further comprising:
    for a first duration following the first event, sensing data values stored at bit cells of the plurality of bit cells using the output current of the first reference cell; and
    for a second duration following the second event, sensing data values stored at bit cells of the plurality of bit cells using the output current of the second reference cell.

14. The method of claim 9, wherein:
    configuring the sense amplifier to utilize the output current of the first reference cell comprises disabling the plurality of reference cells except the first reference cell; and
    configuring the sense amplifier to utilize the output current of the second reference cell comprises disabling the plurality of reference bit-cells except the second reference cell.

15. A memory device comprising:
    a bit cell array comprising a plurality of bit cells;
    a plurality of reference cells associated with the plurality of bit cells;
    a sense amplifier comprising an input to receive a reference current, the sense amplifier configured to sense data values stored at bit cells of the bit cell array based on the reference current; and
    a reference controller configured to provide an output current of a first reference cell of the plurality of reference cells to the sense amplifier as the reference current for sensing a bit cell of the plurality of bit cells in response to determining the first reference cell as having the highest output current of the plurality of reference cells.

16. The memory device of claim 15, wherein the reference controller is configured to determine the first reference cell in response to an event.

17. The memory device of claim 16, wherein the event comprises one selected from a group consisting of: a power-on event; a reset event; an interrupt event; and a lapse of a predetermined duration.

18. The memory device of claim 15, wherein the reference controller comprises:
    a comparator comprising a first input coupled to a current electrode of a first reference cell of the plurality of reference cells, a second input coupled to a current electrode of a second reference cell of the plurality of reference cells, the comparator configured to provide an output value representative of a comparison of a first current detected at the first input and a second current detected at the second input; and a word line driver comprising a first word line coupled to a control electrode of the first reference cell of the plurality of reference cells and a second word line coupled to a control electrode of the second reference cell, the word line driver configured to selectively enable one of the first word line and the second word line based on the output value of the comparator.

19. The memory device of claim 18, wherein the reference controller further comprises:

a current summation module configured to provide the reference current based on a current of at least one of the first reference cell and the second reference cell.

20. The memory device of claim 15, wherein the memory device comprises a non-volatile memory device.

* * * * *